(12) United States Patent
Lu (10) Patent No.: US 7,817,075 B2
(45) Date of Patent: Oct. 19, 2010

(54) APPARATUS FOR CONVERTING MEMS INDUCTIVE CAPACITANCE

(75) Inventor: Chih-Shiun Lu, Hsinchu (TW)

(73) Assignee: WindTop Technology Corp., Hsinchu (TW)

( * ) Notice: Subject to any disclaimer, the term of this patent is extended or adjusted under 35 U.S.C. 154(b) by 59 days.

(21) Appl. No.: 12/364,526

(22) Filed: Feb. 3, 2009

(65) Prior Publication Data

US 2010/0194615 A1 Aug. 5, 2010

(51) Int. Cl.
*H03M 3/02* (2006.01)

(52) U.S. Cl. .................. 341/143; 341/172; 324/658

(58) Field of Classification Search .......... 341/143, 341/150, 155, 172; 324/658
See application file for complete search history.

(56) References Cited

U.S. PATENT DOCUMENTS

| | | | | |
|---|---|---|---|---|
| 4,972,436 A | * | 11/1990 | Halim et al. | ................. 341/143 |
| 5,974,895 A | * | 11/1999 | Steger et al. | ................. 73/769 |
| 6,356,085 B1 | * | 3/2002 | Ryat et al. | ................. 324/658 |

* cited by examiner

*Primary Examiner*—Howard Williams (57) ABSTRACT

An apparatus for converting MEMS inductive capacitance to digital is provided, for converting the induced analog voltage of MEMS element into digital signal. The apparatus includes an ADC, a reference voltage circuit and a controller. With the integral circuit and the comparator of the ADC and the reference voltages generated by the reference voltage circuit, the apparatus of the present invention uses the switch signals generated by the controller to generate digital signals. The present invention can also be integrated with MEMS element into a single chip to achieve single-chip MEMS.

6 Claims, 7 Drawing Sheets

APPARATUS FOR CONVERTING MEMS INDUCTIVE CAPACITANCE

FIELD OF THE INVENTION

The present invention generally relates to an apparatus for converting MEMS inductive capacitance, and more specifically to an apparatus for converting MEMS inductive capacitance to digital signal with an analog-to-digital converter (ADC).

BACKGROUND OF THE INVENTION

The applications of Microelectro-mechanical System (MEMS) have gained popularity in many consumer electronic products. For example, Wii from Nintendo uses a MEMS-based three-axial acceleration sensor to work with a wireless controller to achieve the highly creative entertainment.

MEMS is an intelligent micro-system, usually including sensor, processor or enabler so that a single chip or a multi-chip set can integrate a plurality of electronic, mechanical, optical, chemical, biological and magnetic functions. MEMS is widely applied to various industries, such as, manufacturing, automation, information and communication, aerospace, transportation, construction, environmental protection, agriculture, forestry, fishery and farming.

MEMS requires appropriate analog-to-digital converters (ADC) to convert the MEMS analog output signal to digital output signal for subsequent information processing by the digital processor, where $\Sigma$-$\Delta$ (sigma-delta) ADC is a common choice of ADC.

Figure 1:
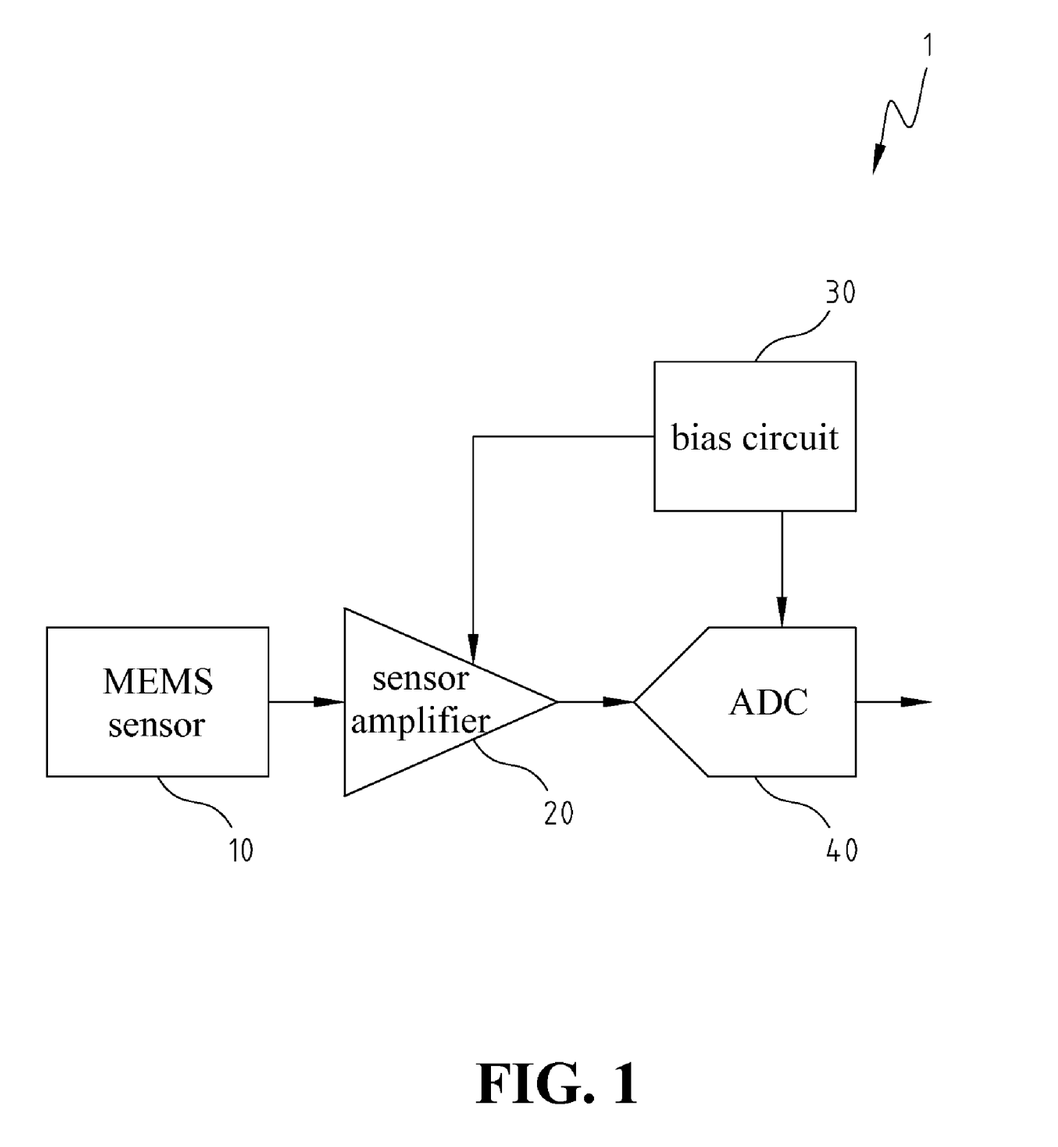
FIG. 1 shows a schematic view of a conventional apparatus for converting MEMS inductive capacitor voltage.

FIG. 1 shows a schematic view of a functional diagram of the conventional apparatus for converting MEMS inductive capacitance. As shown in FIG. 1, an apparatus 1 for converting MEMS inductive capacitance to digital signal includes a MEMS sensor 10, a sensor amplifier 20, a bias circuit 30 and ADC 40, where sensor amplifier 20 amplifies the output signal from MEMS sensor 10, and ADC 40 converts the amplified signal into digital signals. Bias circuitry 30 provides a suitable bias voltage for sensor amplifier 20 and ADC 40.

Figure 2:
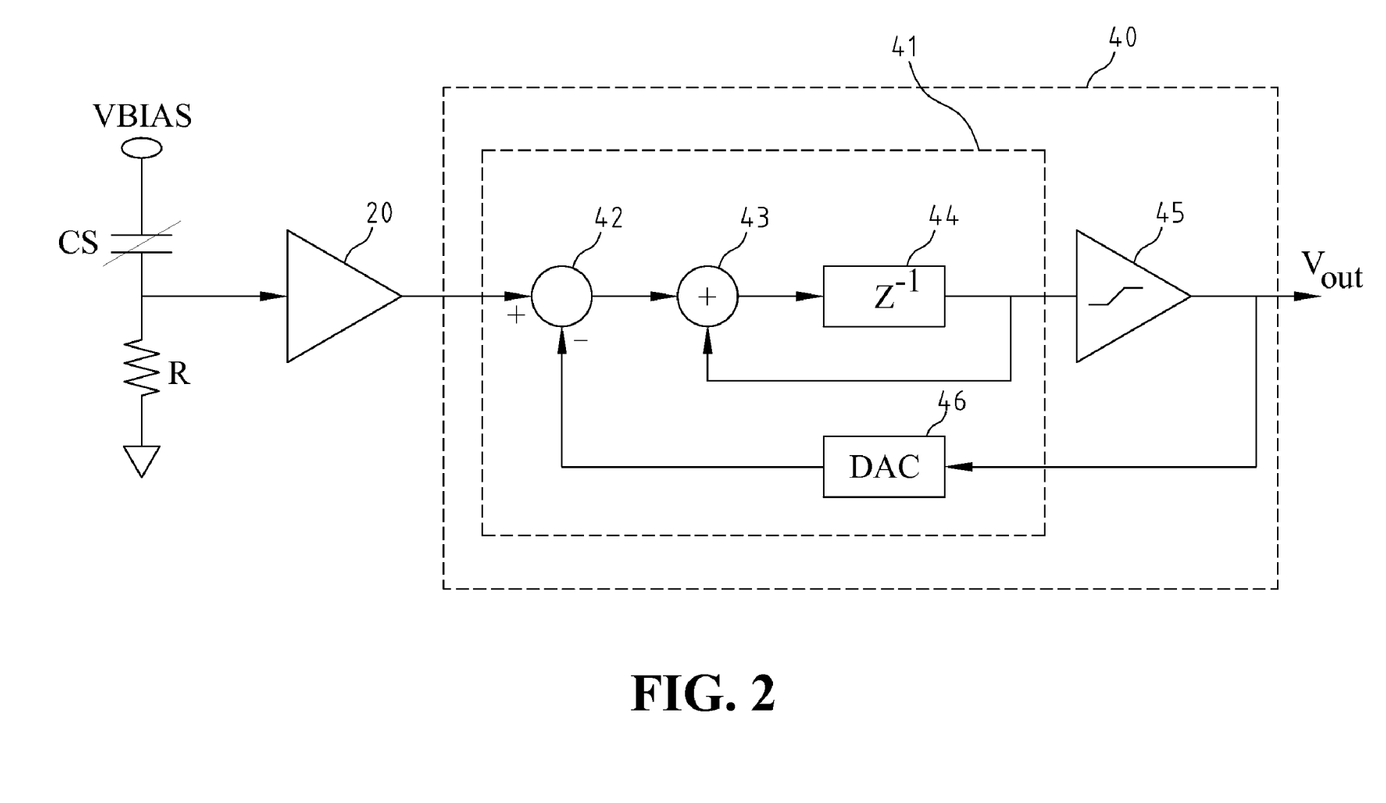
FIG. 2 shows a detailed view of FIG. 1.

FIG. 2 shows a detailed view of FIG. 1. As shown in FIG. 2, the electric model of MEMS sensor 10 shows a MEMS capacitor CS and bias input impedance R. MEMS capacitor CS has a capacitance change $\Delta CS$ about 50 f caused by the external change. Under the condition of bias voltage Vbias=10V, MEMS capacitor CS voltage change $\Delta VCS$ is about 1 mV, which is amplified by sensor amplifier 20 and input to ADC 40. Take a one-stage $\Sigma$-$\Delta$ ADC as an example. ADC 40 includes a first-stage converter circuit 41 and a comparator 45, where first-stage converter circuit 41 further includes a subtracter 42, an adder 43, a delay relay 44 and a digital-to-analog converter (DAC) 46. DAC 46 converts the digital output signal Vout from comparator 45 into analog signal. Subtracter 42 finds the difference between the output signal of sensor amplifier 20 and the output signal of DAC 46. Adder 43 adds the output signal of delay relay 44 to the difference, and outputs to delay relay 44 so as to complete the entire ADC operation. As $\Sigma$-$\Delta$ ADC is a commonly known technique, the above description is only to highlight the key points.

In addition, in a conventional $\Sigma$-$\Delta$ ADC structure, to improve the resolution of ADC, a structure with a plurality of serial stages is usually used. That is, the output signal of first-stage converter circuit 41 can be passed to the next stage converter circuit, and the last stage converter circuit is connected to the comparator.

However, the conventional technique has the drawback of requiring a bias circuit able to generate a high bias voltage (about 10V or higher) so as to increase the sensing sensitivity to MEMS. Because the sensitivity of MEMS increases as the bias voltage increases, it is a difficult challenge for the general IC fabrication process, and also difficult to integrate into the other existing function blocks operating at low voltage.

Another drawback of the conventional technique is requiring a high quality amplifier to amplify the 1-mV MEMS output signal to the voltage range processable by ADC. As the amplifier requires a large size chip area, the chip cost increases and the offset, gain and noise of the amplifier will also increase the signal error.

Hence, it is imperative to devise an apparatus able to use ADC to directly convert the low level output signal of MEMS to digital signal to save the sensor amplifier and the bias circuit to facilitate a smaller-size chip area.

SUMMARY OF THE INVENTION

The primary object of the present invention is to provide an apparatus for converting MEMS inductive capacitance to digital signal, by using ADC, a reference voltage circuit, a plurality of switches and a controller to convert the inductive voltage of the MEMS capacitor into digital signal, without using an extra high voltage bias circuit and a high quality sensor amplifier, where the ADC includes a plurality of stages of integral circuits and a comparator, a reference voltage circuit generates required reference voltage to collaborate with the switching signals generated by the controller for switching the switches so as to achieve the digital signal corresponding to the MEMS inductive capacitor voltage.

Another objective of the present invention is to provide an apparatus for converting MEMS inductive capacitance to digital, by using a differential ADC with differential integral circuit to convert the MEMS inductive capacitor voltage into digital signal in a differential manner so as to improve the anti-noise ability.

Yet another objective of the present invention is to provide an apparatus for converting MEMS inductive capacitance, able to use differential ADCs with differential integral circuits to convert a plurality of MEMS inductive capacitor voltages into digital signals in a differential manner so as to save the chip area, improve the integration capability, and extend the applications.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The apparatus for converting MEMS inductive capacitance to digital of the present invention integrates the sensor amplifier of the conventional technology into the first-stage integral circuit of ADC, and saves the bias circuit used in the conventional technology. Instead, the present invention uses the reference voltage generated by a built-in reference circuit and further includes the MEMS capacitor with above circuits to form input module so as to simplify the overall circuit design and achieve the objectives of not using high bias voltage.

Figure 3:
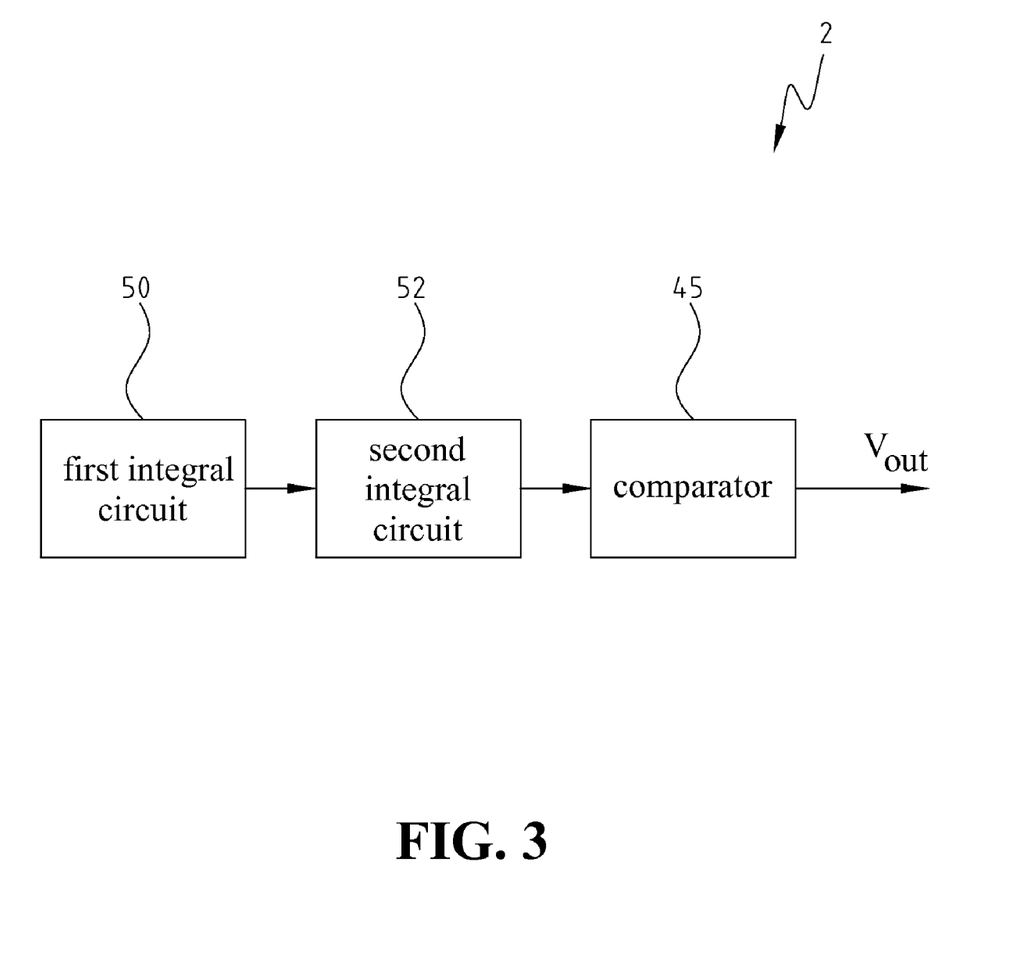
FIG. 3 shows a schematic view of a first embodiment of the apparatus for converting MEMS inductive capacitor voltage according to the present invention.

FIG. 3 shows a schematic view of a first embodiment of an apparatus for converting MEMS inductive capacitance according to the present invention. As shown in FIG. 3, an apparatus 2 for converting MEMS inductive capacitance of the present invention includes a first-stage integral circuit 50, a second-stage integral circuit 52 and a comparator 45, where second-stage integral circuit 52 can be implemented with a general amplifier and an integral capacitor, and comparator 45 can be a conventional comparator. Output signal Vout is the output signal of comparator 45. Hence, the present invention is the novel structure of first-stage integral circuit 50.

Figure 4:
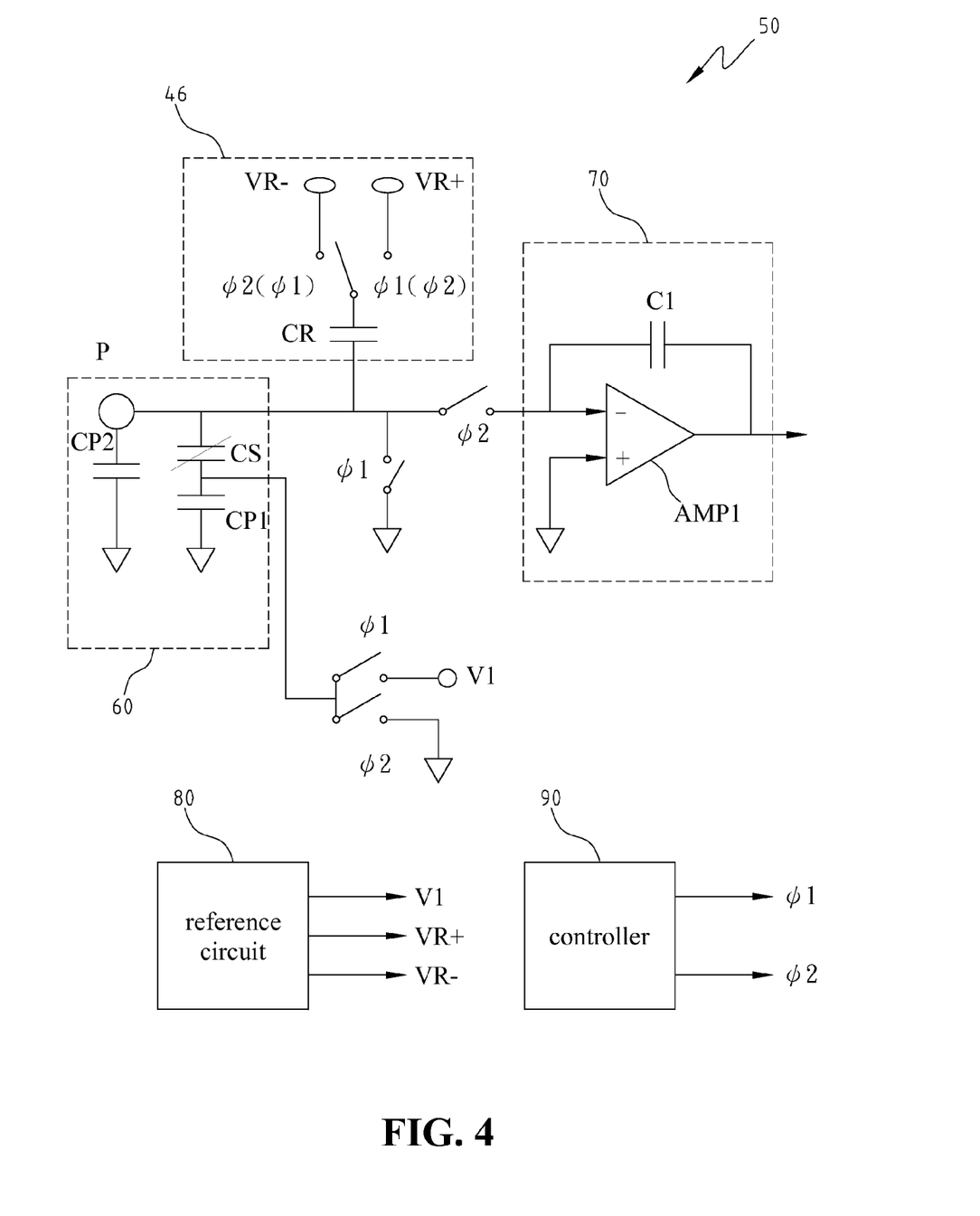
FIG. 4 shows a schematic view of the first-stage integral circuit of FIG. 3.

FIG. 4 shows a schematic view of the first-stage integral circuit of FIG. 3. As shown in FIG. 4, first-stage integral circuit 50 is an integral circuit with a single end structure. First-stage integral circuit 50 includes a DAC 46, an input module 60, a single-end integral circuit 70, reference circuit 80, controller 90 and a plurality of switches. Input module 60 includes a MEMS capacitor CS, and capacitors CP1, CP2. The voltage on node P is the inductive voltage of MEMS capacitor CS. Single-end integral circuit 70 includes an integral capacitor C1 and an amplifier AMP1. Reference circuit 80 generates a first reference voltage V1, high level reference voltage VR+ and low level reference voltage VR−. Controller 90 generates a first switch signal φ1 and a second switch signal φ2 for controlling the plural switches.

DAC 46 includes a capacitor CR and a switch controlled by first switch signal φ1 and second switch signal φ2, where controller 90 outputs an appropriate first switch signal φ1 (second switch signal φ2) according to digital output signal Vout of comparator 45 to switch one end of capacitor CR to either high level reference voltage VR+ or low level reference voltage VR−, and the other end of capacitor CR is connected to node P so as to use DAC 46 to realize DAC function. When first switch signal φ1 (second switch signal φ2) is at high level, capacitor CR is connected to low level reference voltage VR− (high level reference voltage VR+), and when second switch signal φ2 (first switch signal φ1) is at high level, capacitor CR is connected to low level reference voltage VR− (high level reference voltage VR+). First switch signal φ1 and second switch signal φ2 for switching to high level reference voltage VR+ or low level reference voltage VR− are determined by the output of comparator.

Figure 5:
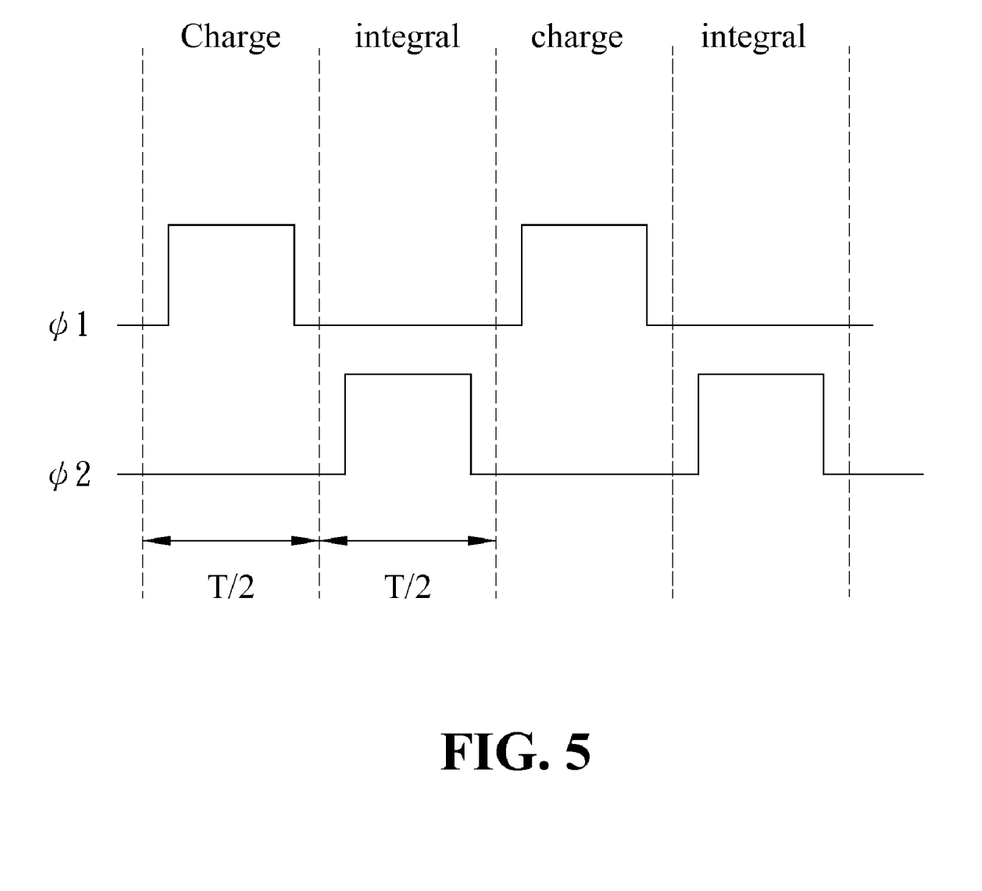
FIG. 5 shows a schematic view of waveforms of the apparatus for converting the MEMS inductive capacitor voltage.

FIG. 5 shows the schematic view of waveform for the apparatus for converting MEMS inductive capacitor voltage according to the present invention. FIG. 5 shows the operating waveforms of first switch signal φ1 and second switch signal φ2, where when first switch signal φ1 enables the close of corresponding switch to conduct, and second switch signal φ2 enables the open of corresponding switch to shut-off, first integral circuit 50 is to perform the charging operation; when first switch signal φ1 enables the open of corresponding switch to shut-off, and second switch signal φ2 enables the close of corresponding switch to conduct, first integral circuit 50 is to perform the integral operation.

In the charging operation, capacitor CR must be charged to high level reference voltage VR+ or low level reference voltage VR− through first switch signal φ1 or second switch signal φ2. MEMS capacitor CS is also charged to first reference voltage V1. On the other hand, in the integral operation, the accumulated charges on capacitor CR flow to integral capacitor C1 of single-end integral circuit 70 to generate DAC effect, and the accumulated charges on MEMS capacitor CS flow to integral capacitor C1 of single-end integral circuit 70 to generate signal accumulation effect. In the ADC of the single-stage integral circuit structure, single-end integral circuit 70 outputs signal to the comparator to generate the required digital signal. In the ADC of the multi-stage integral circuit structure, single-end integral circuit 70 outputs signal to the next stage integral circuit, and so on; and the last stage integral circuit output signal the comparator to generate the required digital signal.

The period of first switch signal φ1 and second switch signal φ2 is T. Hence, first switch signal φ1 closes the corresponding switch to conduct in T/2, and second switch signal φ2 closes the corresponding switch to conduct in the other T/2. In addition, first switch signal φ1 and second switch signal φ2 do not overlap; that is, first switch signal φ1 and second switch signal φ2 will not close the corresponding switches to conduct simultaneously.

It is worth noting that first-stage integral circuit 50 can be serially connected to a plurality of conventional next-stage integral circuit to construct an ADC with high resolution.

Figure 6:
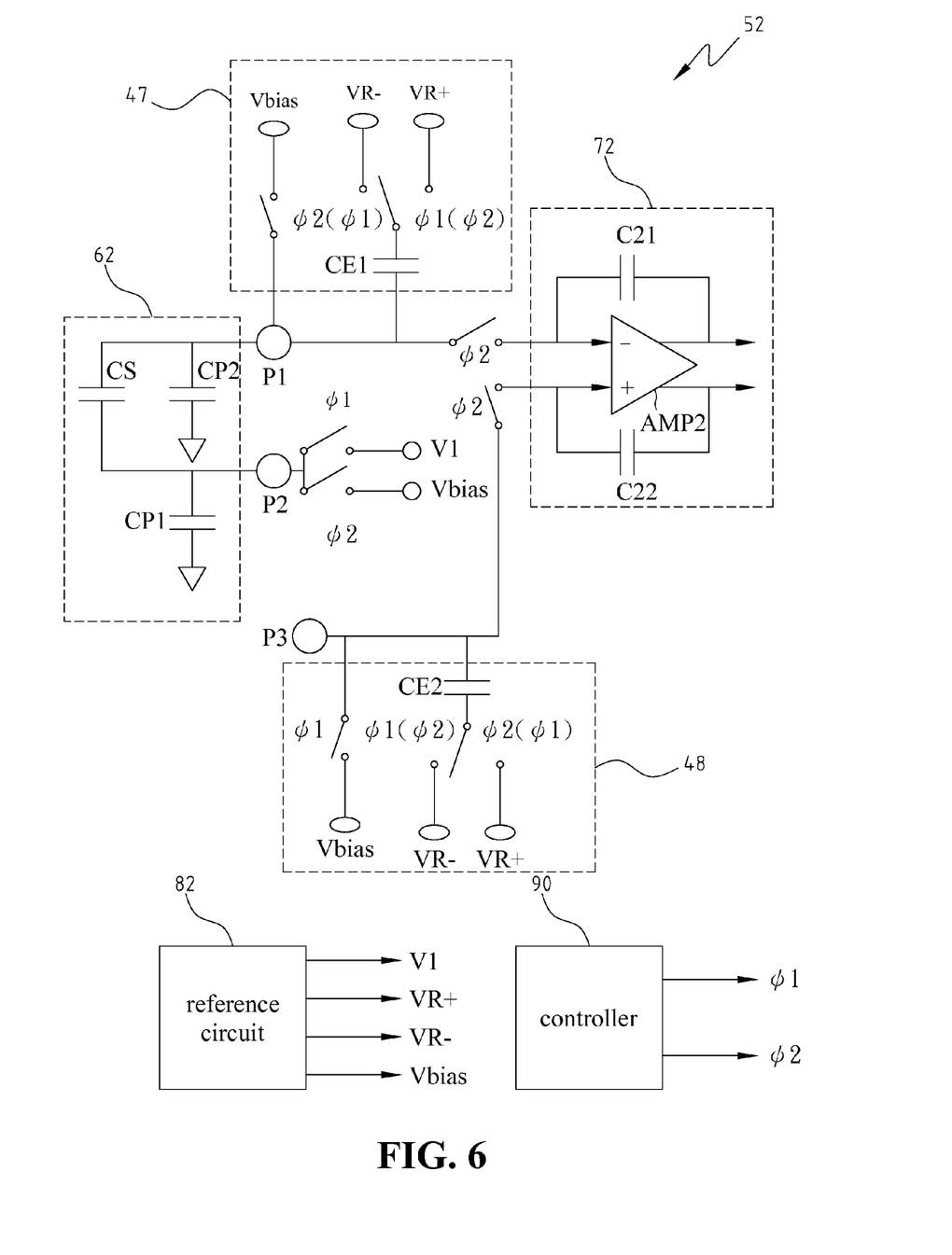
FIG. 6 shows a schematic view of a second embodiment of the first-stage integral circuit according to the present invention.

FIG. 6 shows a schematic view of a second embodiment of the first-stage integral circuit. As shown in FIG. 6, first-stage integral circuit 52 is a differential integral circuit, including a DAC 47, an input module 62, a differential integral circuit 72, a reference circuit 82, a controller 90 and a plurality of switches, where the functions of controller 90 are the same as in the first embodiment, and the functions of reference circuit 82 are similar to the first embodiment, except the ability of outputting bias voltage Vbias.

Input module 62 includes a MEMS capacitor CS, and capacitors CP1, CP2, where one end of MEMS capacitor CS is connected to first node P1 and capacitor CP2, and the other end of MEMS capacitor CS is connected to second node P2 and capacitor CP1. The other ends of both capacitors CP1, CP2 are grounded. Therefore, the interface of input module 62 includes first node P1 and second node P2. Furthermore, first node P1 controls corresponding switch through first switch signal φ1, and is connected to bias voltage Vbias. Second node P2 controls corresponding switch through first switch signal φ1 and second switch signal φ2 to switch to either first reference voltage V1 or bias voltage Vbias.

DAC 47 includes a capacitor CE1, where one end of capacitor CE1 is connected to first node P1, and the other end of capacitor CE1 is switched through the corresponding switch controlled by first switch signal φ1 (second switch signal φ2) to either high level reference voltage VR+ or low level reference voltage VR−. The functions of capacitor CE1 are the same as capacitor CR of DAC 46 of the first embodiment. The difference between DAC 47 and DAC 46 is to use first switch signal φ1 to connect first node P1 to bias voltage Vbias. DAC 48 includes a capacitor CE2, and DAC 47 and DAC48 have the same functions, except that first node P1 of DAC 47 is changed to third node P3.

Differential integral circuit 72 includes an amplifier AMP2 and two integral capacitors C21, C22 for receiving differential input signals and generating differential output signals, where differential output signals can be transmitted to comparator 45 and form a single-stage of integral circuit ADC; alternatively, differential output signals can be transmitted to the next stage integral circuit in a plural serially connected integral circuits, and the last stage integral circuit outputs to comparator 45 to form a multi-stage integral circuit ADC. The operating waveforms of first switch signal $\phi1$ and second switch signal $\phi2$ are shown as in FIG. 5.

Figure 7:
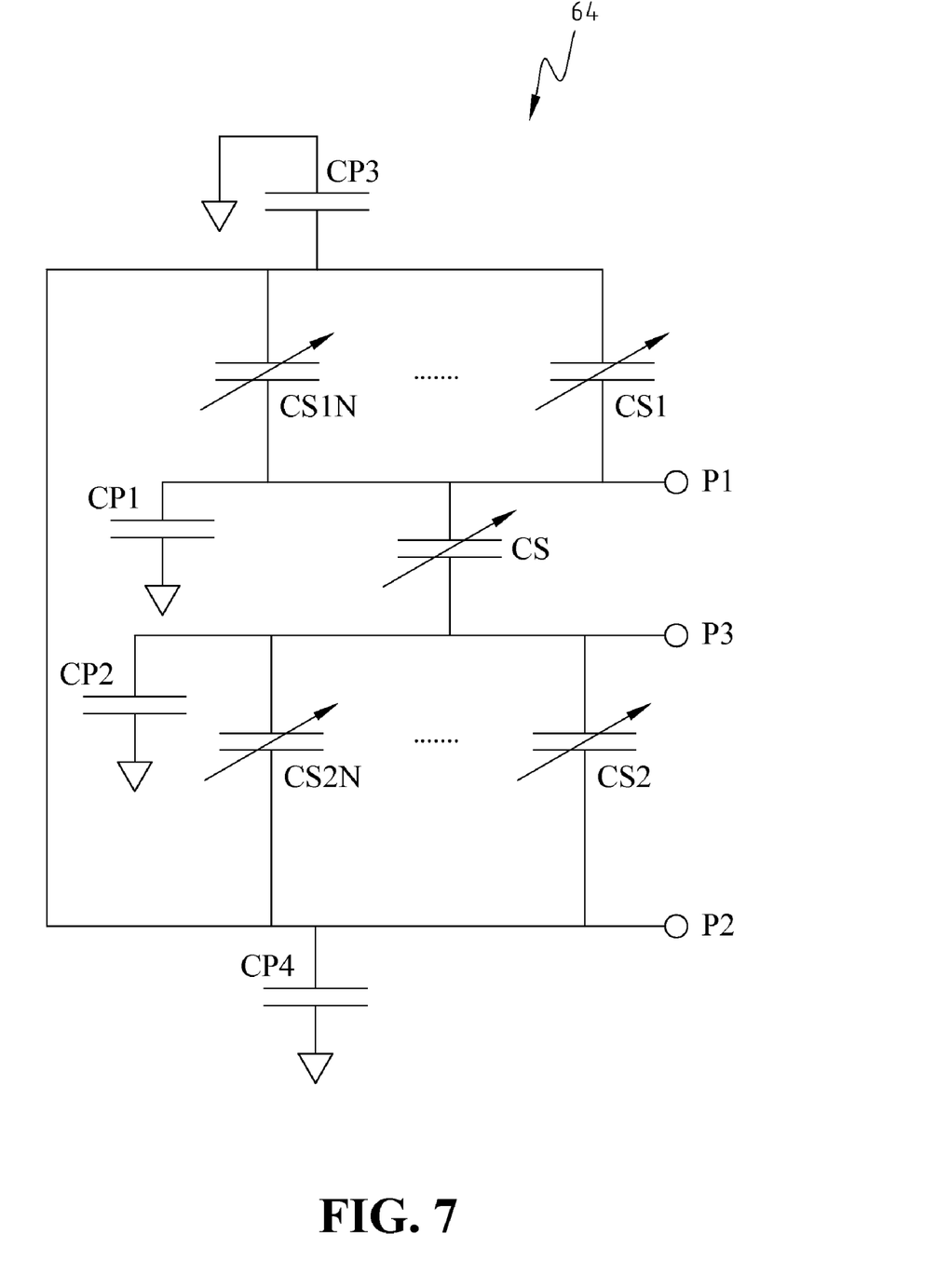
FIG. 7 shows a schematic view of a third embodiment of the input module according to the present invention.

FIG. 7 shows a schematic view of the input module of a third embodiment according to the present invention. As shown in FIG. 7, the present embodiment if applicable to plural MEMS signal conversion, where the interface of input module 64 includes a first node P1, a second node P2 and a third node P3. First node P1, second node P2 and third node P3 are connected to other functional blocks of FIG. 6, except input module 62, such as, DAC 47, DAC 48, differential integral circuit 72, reference circuit 82, controller 90 and a plurality of switches.

Input module 64 includes a plurality of MEMS capacitors CS, CS1, ..., CS1N, CS2, ..., CS2N, and four capacitors CP1, CP2, CP3, CP4, where MEMS capacitor CS and two capacitors CP1, CP2 are connected as in FIG. 6. MEMS capacitors CS1, ..., CS1N have one end connected to first node P1. MEMS capacitor CS1N has the other end connected to one end of capacitor CP3, and the other end of capacitor CP3 is grounded. MEMS capacitors CS1, ..., CS1N, with the exception of CS1N, have the other end connected to second node P2. MEMS capacitors CS2, ..., CS2N and capacitor CP4 are connected in a manner similar to the connection of MEMS capacitors CS1, ..., CS1N and capacitor CP3. In addition, the operating waveforms of first switch signal $\phi1$ and second switch signal $\phi2$ are as shown in FIG. 5 so that the present embodiment can convert the inductive voltages of plural MEMS into digital signals.

Therefore, the present invention provides single-end integral circuit or the first-stage of differential integral circuit. Combined with the reference voltage generated by built-in reference circuit and the bias voltage, the present invention uses a controller to generate control signals for controlling switches to realize the ADC functions. The present invention has the advantages of saving sensor amplifier and bias circuit, as well as achieving high sensitivity effect by directly sampling MEMS capacitor voltage.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus for converting a MEMS inductive capacitance of a MEMS element into a digital signal, said apparatus comprising:
    a first-stage integral circuit including:
        an input module having an equivalent MEMS capacitor of said MEMS element, a first capacitor and a second capacitor, said equivalent MEMS capacitor having a first end connected to a first node and a second end connected to a second node, said first capacitor having a first end connected to said second node and a second end grounded, said second capacitor having a first end connected to said first node and a second end grounded;
        an integral circuit having a first integral capacitor and a first integral amplifier, said first integral amplifier having an inverted input end, a non-inverted input end and an output end, said first integral capacitor having a first end connected to said inverted input end and a second end connected to said output end, said non-inverted input end being grounded and said output end generating an output signal of said first-stage integral circuit;
        a reference circuit generating a first reference voltage, a low level reference voltage and a high level reference voltage;
        first, second, third, fourth and fifth switches, said second switch having a first end grounded and a second end connected to said first node, said third switch having a first end connected to said first node and a second end connected to said inverted input end of said first integral amplifier;
        a controller generating a first switch signal for controlling said first, second and fourth switches and a second switch signal for controlling said third and fifth switches, a high level of said first switch signal and a high level of said second switch signal being non-overlapping;
        a charge/discharge capacitor having a first end connected to said first node and a second end connected through said first switch to said high level reference voltage when said first switch signal is at high level and connected through said first switch to said low level reference voltage when said second switch signal is at high level;
        wherein said second node is connected through said fourth switch to said first reference voltage when said first switch signal is at high level, and said second node is connected through said fifth switch to ground when said second switch signal is at high level;
    a comparator; and
    at least a second-stage integral circuit;
    wherein said second-stage integral circuit receives said output signal of said first-stage integral circuit and generates an output signal to said comparator for generating said digital signal.

2. The apparatus as claimed in claim 1, wherein said second-stage integral circuit comprises a second integral capacitor and a second integral amplifier, said second integral amplifier having an inverted input end, a non-inverted input end and an output end, said second integral capacitor having a first end connected to said inverted input end of said second integral amplifier and a second end connected to said output end of said second integral amplifier, said non-inverted input end of said second integral amplifier being grounded and said output end of said second integral amplifier generating an output signal of said second-stage integral circuit.

3. An apparatus for converting a MEMS inductive capacitance of a MEMS element into a digital signal, said apparatus comprising:
    a first-stage differential integral circuit including:
        an input module having an equivalent MEMS capacitor of said MEMS element, a first capacitor and a second capacitor, said equivalent MEMS capacitor having a first end connected to a first node and a second end connected to a second node, said first capacitor having a first end connected to said first node and a second end grounded, said second capacitor having a first end connected to said second node and a second end grounded;

a reference circuit generating a first reference voltage, a bias voltage, a low level reference voltage and a high level reference voltage;

a controller generating a first switch signal and a second switch signal, a high level of said first switch signal and a high level of said second switch signal being non-overlapping;

a first digital-to-analog converter (DAC) comprising a first charge/discharge capacitor, a first switch controlled by said second switch signal, and a second switch controlled by said first and second switch signals, said first switch having a first end connected to said first node and a second end connected to said bias voltage, said first charge/discharge capacitor having a first end connected to said first node and a second end connected through said second switch to said low level reference voltage when said second switch signal is at high level and to said high level reference voltage when said first switch signal is at high level;

a second DAC comprising a second charge/discharge capacitor, a third switch controlled by said first switch signal, and a fourth switch controlled by said first and second switch signals, said third switch having a first end connected to a third node and a second end connected to said bias voltage, said second charge/discharge capacitor having a first end connected to said third node and a second end connected through said fourth switch to said low level reference voltage when said first switch signal is at high level and to said high level reference voltage when said second switch signal is at high level;

a differential integral circuit having an inverted input end, a non-inverted input end, an inverted output end and a non-inverted output end, and comprising a first integral capacitor, a second integral capacitor and a first differential integral amplifier, said first integral capacitor having a first end connected to said inverted input end of said differential integral circuit and a second end connected to said inverted output end of said differential integral circuit, said first differential integral amplifier having an inverted input end connected to said inverted input end of said differential integral circuit and an inverted output end connected to said inverted output end of said first differential integral circuit, said second integral capacitor having a first end connected to said non-inverted input end of said first differential integral circuit and a second end connected to said non-inverted output end of said differential integral circuit, and said first differential integral amplifier having a non-inverted input end connected to said non-inverted input end of said differential integral circuit and a non-inverted output end connected to said non-inverted output end of said differential integral circuit;

a first node controller having a fifth switch controlled by said second switch signal, said fifth switch having a first end connected to said first node and a second end connected to said inverted input end of said differential integral circuit;

a second node controller having a seventh switch controlled by said first switch signal and an eighth switch controlled by said second switch signal, said seventh switch having a first end connected to said second node and a second end connected to said first reference voltage, and said eighth switch having a first end connected to said second node and a second end connected to said bias voltage; and a third node controller having a sixth switch controlled by said second switch signal, said sixth switch having a first end connected to said third node and a second end connected to said non-inverted input end of said differential integral circuit;

a differential comparator; and at least a second-stage differential integral circuit;

wherein said first-stage differential integral circuit generates a pair of differential output signals, said second-stage differential integral circuit receives said differential output signals of said first-stage differential integral circuit and generates a pair of differential output signals, and said differential comparator receives said differential output signals of said second-stage differential integral circuit and generates said digital signal.

4. The apparatus as claimed in claim 3, wherein said second-stage differential integral circuit comprises:

a second differential integral amplifier having an inverted input end connected to an inverted input end of said second-stage differential integral circuit, an inverted output end connected to said inverted output end of said second-stage differential integral circuit, a non-inverted input end connected to a non-inverted input end of said second-stage differential integral circuit, and a non-inverted output end connected to a non-inverted output end of said second-stage differential integral circuit;

a third integral capacitor having a first end connected to said inverted input end of said second-stage differential integral circuit and a second end connected to said inverted output end of said second-stage differential integral circuit; and a fourth integral capacitor having a first end connected to said non-inverted input end of said second-stage differential integral circuit and a second end connected to said non-inverted output end of said second-stage differential integral circuit.

5. An apparatus for converting a plurality of MEMS inductive capacitor voltages of a plurality of MEMS elements into a digital signal, said apparatus comprising: a first-stage differential integral circuit, a differential comparator, and at least a second-stage differential integral circuit;

a first-stage differential integral circuit including:

an input module having a plurality of equivalent MEMS capacitors of said MEMS elements, a first capacitor, a second capacitor, a third capacitor and a fourth capacitor, said equivalent MEMS capacitors further comprising a first equivalent MEMS capacitor, a first group of parallel equivalent MEMS capacitors and a second group of parallel equivalent MEMS capacitors, said first equivalent MEMS capacitor having a first end connected to a first node and a second end connected to a third node, said first capacitor having a first end connected to said first node and a second end grounded, said second capacitor having a first end connected to said third node and a second end grounded, said third capacitor having a first end connected to said second node and a second end grounded, said fourth capacitor having a first end connected to said second node and a second end connected grounded, said first group of parallel equivalent MEMS capacitors having a first end connected to said first node and a second end connected to said second node, said second group of parallel equivalent MEMS capacitors having a first end connected to said third node and a second end connected to said second node;

a reference circuit generating a first reference voltage, a bias voltage, a low level reference voltage and a high level reference voltage;

a controller generating a first switch signal and a second switch signal, a high level of said first switch signal and a high level of said second switch signal being non-overlapping;

a first digital-to-analog converter (DAC) comprising a first charge/discharge capacitor, a first switch controlled by said second switch signal, and a second switch controlled by said first and second switch signals, said first switch having a first end connected to said first node and a second end connected to said bias voltage, said first charge/discharge capacitor having a first end connected to said first node and a second end connected through said second switch to said low level reference voltage when said second switch signal is at high level and to said high level reference voltage when said first switch signal is at high level;

a second DAC comprising a second charge/discharge capacitor, a third switch controlled by said first switch signal, and a fourth switch controlled by said first and second switch signals, said third switch having a first end connected to a third node and a second end connected to said bias voltage, said second charge/discharge capacitor having a first end connected to said third node and a second end connected through said fourth switch to said low level reference voltage when said first switch signal is at high level and to said high level reference voltage when said second switch signal is at high level;

a differential integral circuit having an inverted input end, a non-inverted input end, an inverted output end and a non-inverted output end, and comprising a first integral capacitor, a second integral capacitor and a first differential integral amplifier, said first integral capacitor having a first end connected to said inverted input end of said differential integral circuit and a second end connected to said inverted output end of said differential integral circuit, said first differential integral amplifier having an inverted input end connected to said inverted input end of said differential integral circuit and an inverted output end connected to said inverted output end of said first differential integral circuit, said second integral capacitor having a first end connected to said non-inverted input end of said first differential integral circuit and a second end connected to said non-inverted output end of said differential integral circuit, and said first differential integral amplifier having a non-inverted input end connected to said non-inverted input end of said differential integral circuit and a non-inverted output end connected to said non-inverted output end of said differential integral circuit;

a first node controller having a fifth switch controlled by said second switch signal, said fifth switch having a first end connected to said first node and a second end connected to said inverted input end of said differential integral circuit;

a second node controller having a seventh switch controlled by said first switch signal and an eighth switch controlled by said second switch signal, said seventh switch having a first end connected to said second node and a second end connected to said first reference voltage, and said eighth switch having a first end connected to said second node and a second end connected to said bias voltage; and a third node controller having a sixth switch controlled by said second switch signal, said sixth switch having a first end connected to said third node and a second end connected to said non-inverted input end of said differential integral circuit;

a differential comparator; and at least a second-stage differential integral circuit;

wherein said first-stage differential integral circuit generates a pair of differential output signals, said second-stage differential integral circuit receives said differential output signals of said first-stage differential integral circuit and generates a pair of differential output signals, and said differential comparator receives said differential output signals of said second-stage differential integral circuit and generates said digital signal.

6. The apparatus as claimed in claim 5, wherein said second-stage differential integral circuit comprises:

a second differential integral amplifier having an inverted input end connected to an inverted input end of said second-stage differential integral circuit, an inverted output end connected to said inverted output end of said second-stage differential integral circuit, a non-inverted input end connected to a non-inverted input end of said second-stage differential integral circuit, and a non-inverted output end connected to a non-inverted output end of said second-stage differential integral circuit;

a third integral capacitor having a first end connected to said inverted input end of said second-stage differential integral circuit and a second end connected to said inverted output end of said second-stage differential integral circuit; and a fourth integral capacitor having a first end connected to said non-inverted input end of said second-stage differential integral circuit and a second end connected to said non-inverted output end of said second-stage differential integral circuit.

* * * * *